(12) United States Patent
Schröder et al.

(10) Patent No.: US 10,056,393 B2
(45) Date of Patent: Aug. 21, 2018

(54) APPLICATION OF ANTIFERROELECTRIC LIKE MATERIALS IN NON-VOLATILE MEMORY DEVICES

(71) Applicant: NaMLab gGmbH, Dresden (DE)

(72) Inventors: Uwe Schröder, Dresden (DE); Milan Pešić, Dresden (DE)

(73) Assignee: NaMLab gGmbH, Dresden (DE)

( * ) Notice: Subject to any disclaimer, the term of this patent is extended or adjusted under 35 U.S.C. 154(b) by 32 days.

(21) Appl. No.: 15/057,884

(22) Filed: Mar. 1, 2016

(65) Prior Publication Data

US 2017/0256552 A1    Sep. 7, 2017

(51) Int. Cl.
| | |
|---|---|
| *H01L 27/115* | (2017.01) |
| *H01L 29/51* | (2006.01) |
| *H01L 29/78* | (2006.01) |
| *H01L 49/02* | (2006.01) |
| *G11C 11/56* | (2006.01) |

(Continued)

(52) U.S. Cl.
CPC .... *H01L 27/11507* (2013.01); *G11C 11/2273* (2013.01); *G11C 11/2275* (2013.01); *G11C 11/24* (2013.01); *G11C 11/5657* (2013.01); *G11C 13/0007* (2013.01); *H01L 28/56* (2013.01); *H01L 29/516* (2013.01); *H01L 29/78391* (2014.09)

(58) Field of Classification Search
CPC ............. H01L 27/11507; H01L 29/516; H01L 29/78391; H01L 28/56; H01L 2924/1441; H01L 21/28291; G11C 11/5657; G11C 11/24; G11C 11/2273; G11C 11/2275; G11C 13/0007

See application file for complete search history.

(56) References Cited

U.S. PATENT DOCUMENTS

| | | | | | |
|---|---|---|---|---|---|
| 3,715,620 | A | * | 2/1973 | Marro | .......... H01J 31/50 250/214 VT |
| 3,869,356 | A | * | 3/1975 | Long | .......... C23C 18/405 106/1.18 |

(Continued)

FOREIGN PATENT DOCUMENTS

| | | | | |
|---|---|---|---|---|
| DE | 102004011432 A1 | * | 9/2005 | ....... H01L 21/28291 |
| WO | WO 0017929 A1 | * | 3/2000 | ....... H01L 21/28291 |
| WO | WO 0067331 A1 | * | 11/2000 | ....... H01L 21/28291 |

*Primary Examiner* — Steven Loke
*Assistant Examiner* — Juanita Rhodes
(74) *Attorney, Agent, or Firm* — Edell, Shapiro & Finnan, LLC

(57) ABSTRACT

Integrated devices comprising pinched hysteresis loop (PHL) materials in a capacitor or a transistor stack are disclosed. PHL materials include field induced ferroelectrics (FFE), anti-ferroelectric (AFE) and relaxor type ferroelectric (RFE) materials. Each integrated device includes a material stack with a PHL material layer disposed between two electrodes. Application of this material is dependent on inducing of an electric field bias over the stack. According to one option, electrodes having different workfunction values can be employed to induce the required built-in bias field and enable use of PHL materials. According to another option, a PHL material and charges, e.g., a charge interlayer, are disposed between two electrodes such that an induced built-in bias field appears. Integrated devices employing the PHL material stack include memories, transistors, and piezo- and pyroelectric devices.

24 Claims, 14 Drawing Sheets

(51) Int. Cl.
*G11C 11/24* (2006.01)
*G11C 11/22* (2006.01)
*G11C 13/00* (2006.01)
*H01L 27/11507* (2017.01)

(56) References Cited

U.S. PATENT DOCUMENTS

2002/0142487 A1* 10/2002 Li .................... H01L 21/28291
                                                    438/3
2005/0068822 A1*  3/2005 Kijima .............. H01L 21/28291
                                                    365/202
2016/0248007 A1*  8/2016 Hersam .............. H01L 27/2463

* cited by examiner

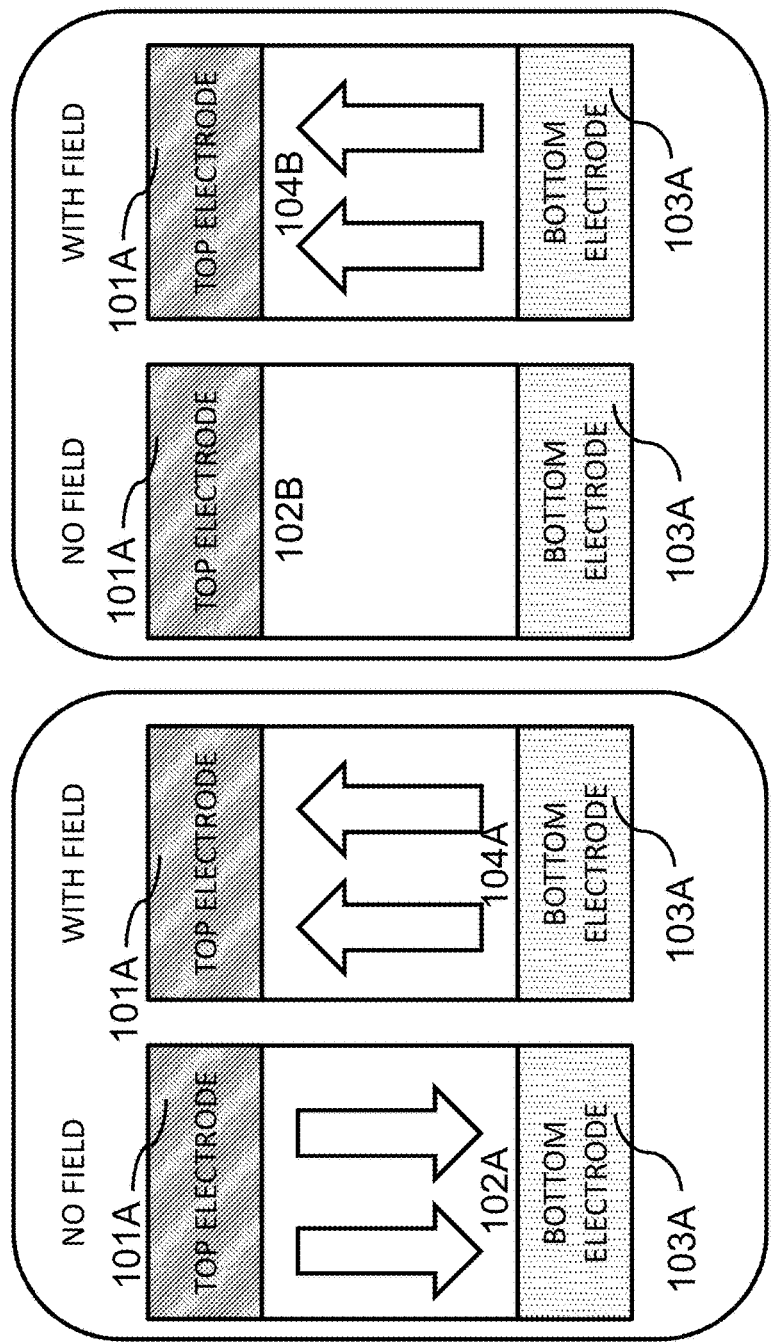

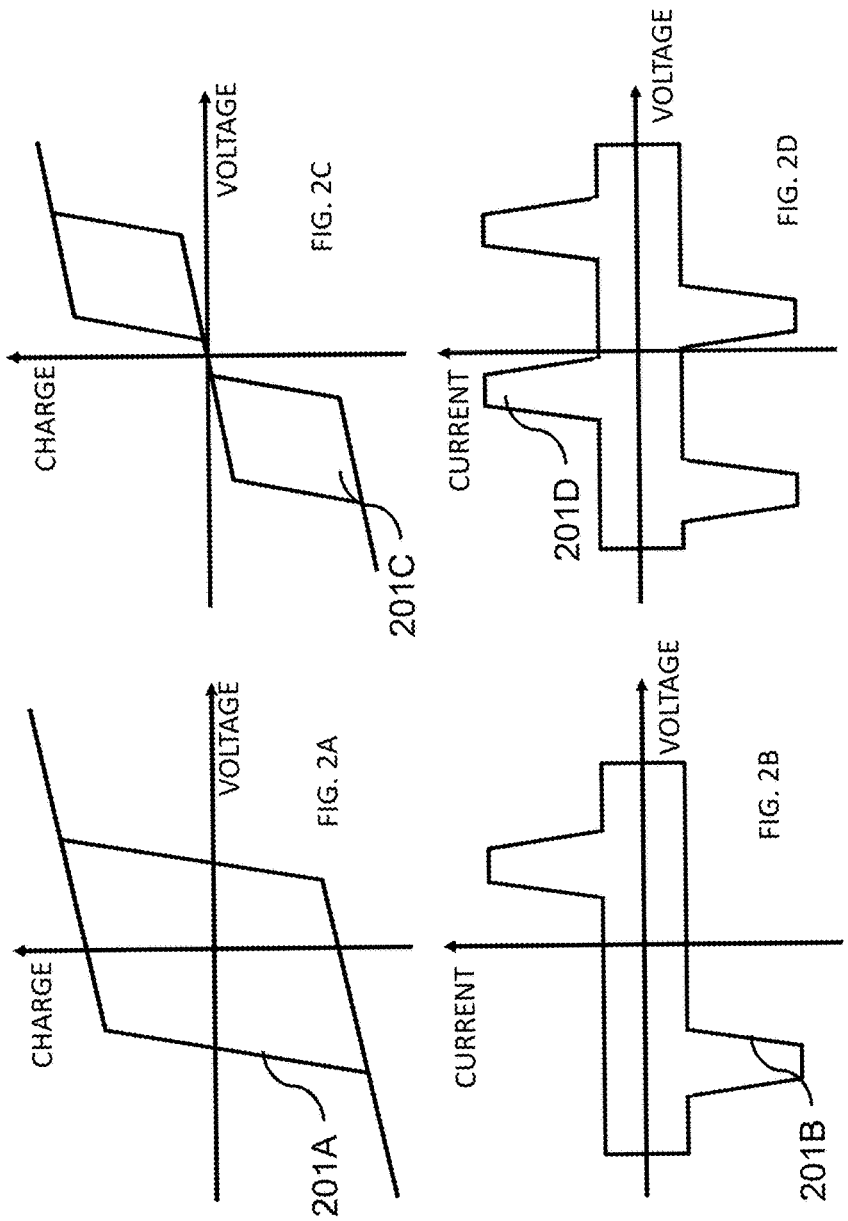

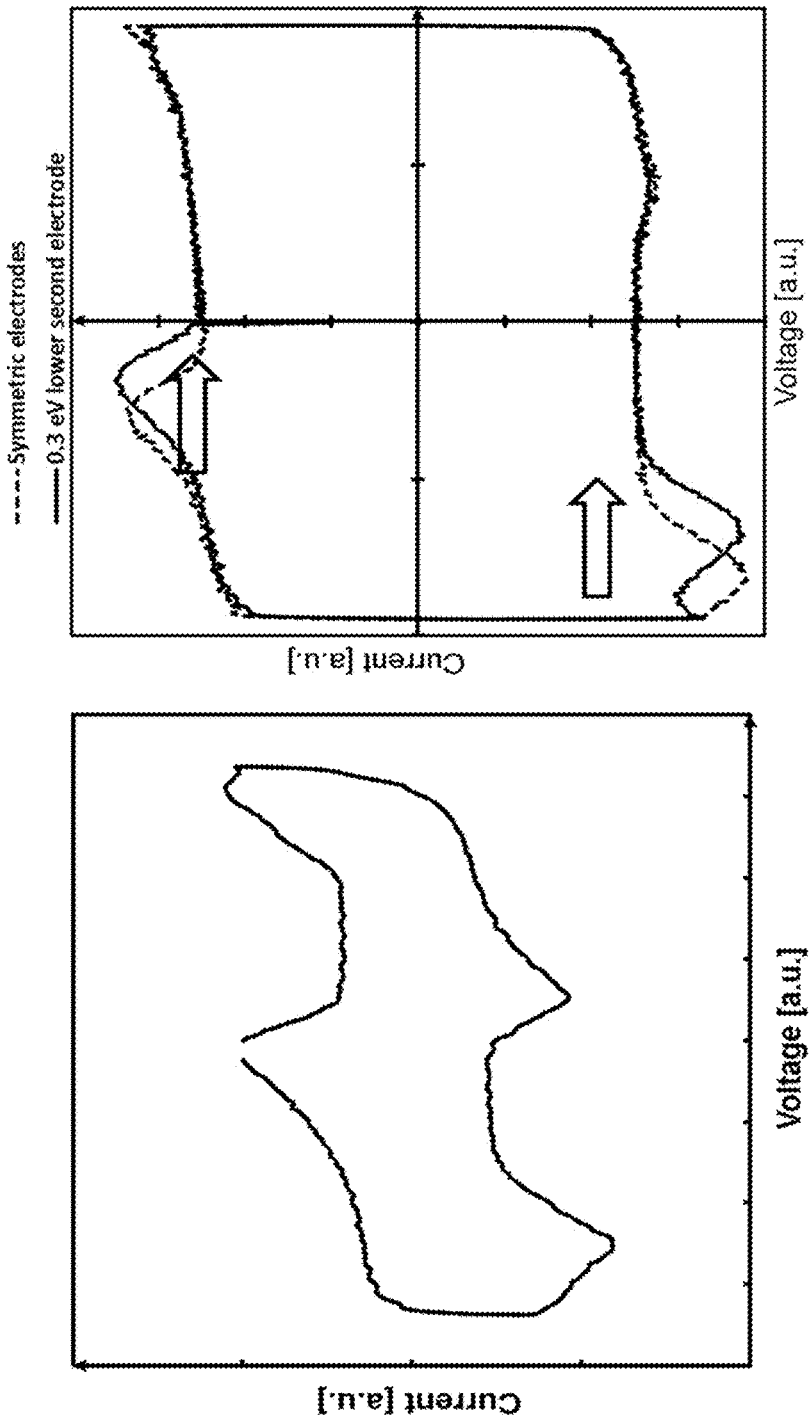

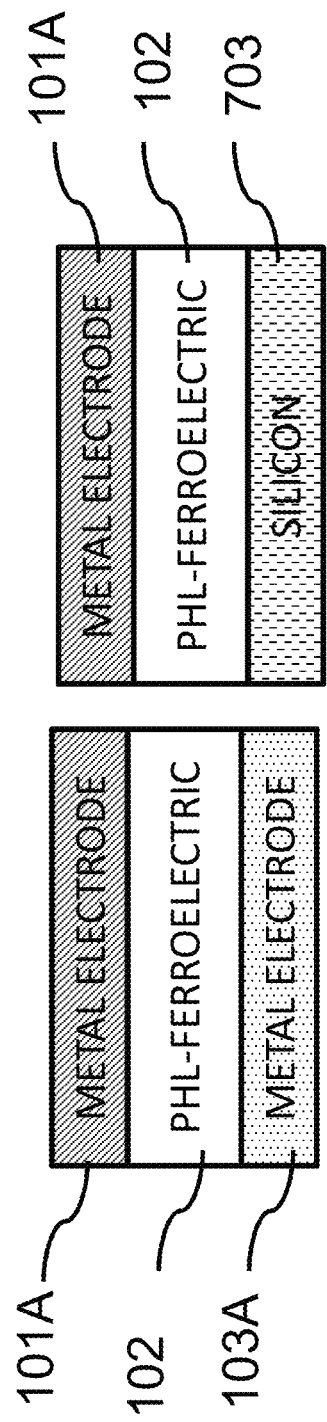

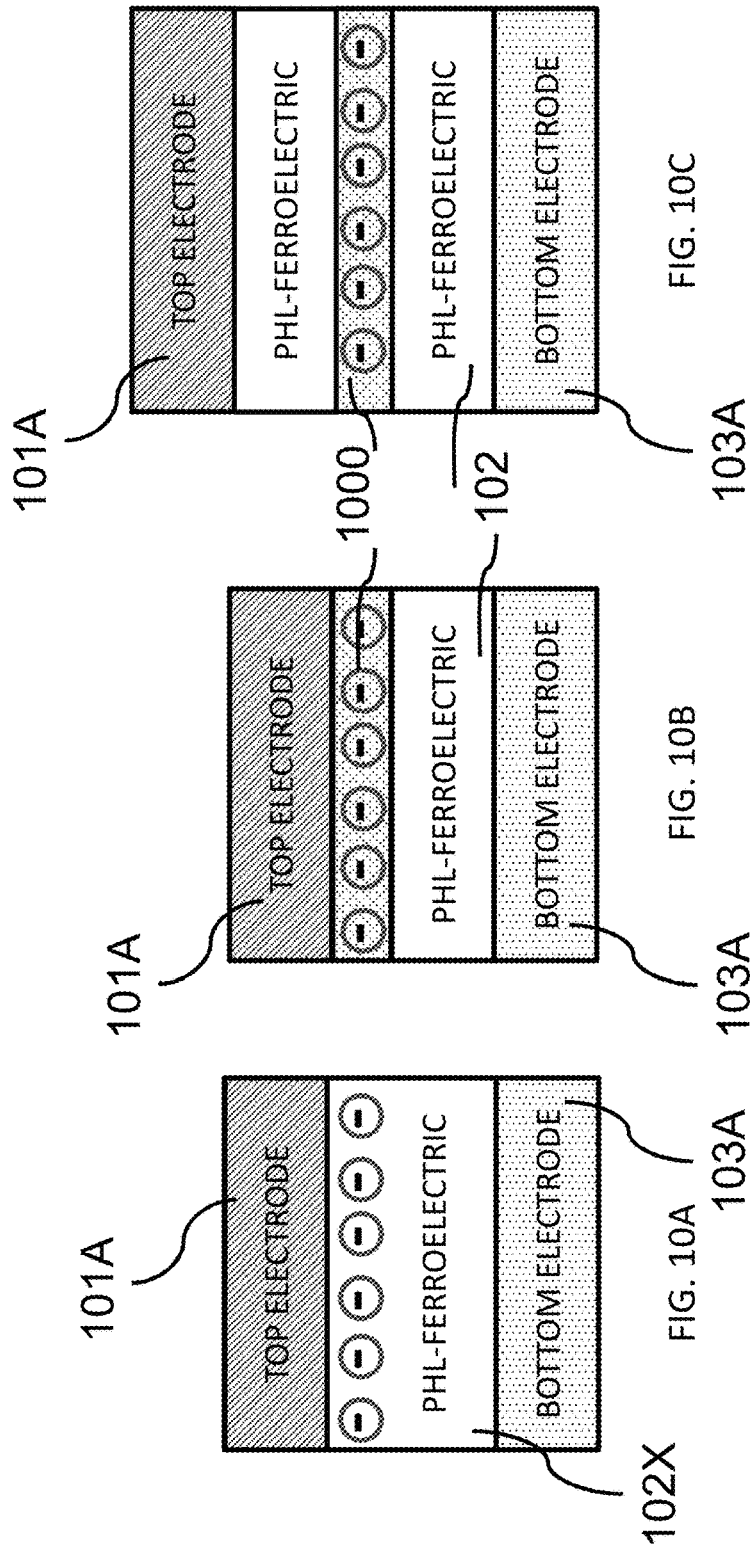

APPLICATION OF ANTIFERROELECTRIC LIKE MATERIALS IN NON-VOLATILE MEMORY DEVICES

BACKGROUND

A ferroelectric (FE) material is a dielectric crystal that exhibits a spontaneous electric polarization. The direction of spontaneous polarization can be reversed between two crystallographic defined states by application of an external electric field. This material property of two clearly distinct states can be used for a memory application to store information, i.e., the representation of two binary states, 0 and 1.

Ferroelectric materials exhibit ferroelectricity only below the Curie temperature $T_c$, which in literature is also known as the phase transition temperature. Since the phase transition temperature is a material property, its value covers a vast spectrum of temperatures. Above this temperature the material exhibits paraelectric properties and behavior.

The discovery of ferroelectric barium titanate ($BaTiO_3$) triggered an increase in research on ferroelectric materials, since it was widely recognized that the existence of robust, chemically stable, and relatively inert ferroelectric crystals offered an electrically switchable, two-state device. The main advantage of such a device was represented through its ability to encode the 1 and 0 states required for the Boolean algebra of binary computer memories. In ferroelectric memory devices, the polarization state determines the information to be stored, with the binary states being represented through the positive and negative states of polarization.

The concept of the Ferroelectric Random Access Memory (FeRAM) was utilized as a basic nonvolatile memory cell consisting of a one transistor and one capacitor (1T-1C) configuration whose dielectric is ferroelectric. Here, in comparison to the standard DRAM capacitor, where an inevitable discharge is caused by leakage currents through the access transistor, a FeRAM does not exhibit a memory loss over time, since information is stored in a permanent position shift of ions. Another possibility for storing information in an FE layer is within a ferroelectric field effect transistor (FeFET). Here, the polarization state of the dielectric layer in a FeFET device changes the threshold voltage of the transistor.

With the discovery of the ferroelectric properties of silicon doped hafnium oxide ($Si:HfO_2$), the integrability and scalability of the ferroelectric field effect transistor (FeFET) as well as the ferroelectric random access memory (FRAM) was drastically improved. A low power, non-volatile memory FeFET based on PZT was proposed in 1963 by J. L. Moll, et al. However, these devices have never reached mass production due to compatibility issues with CMOS processing, limited retention, and their difficult scalability. The discovery of the ferroelectric properties in doped hafnium oxide has changed this situation. After reaching CMOS compatibility and state-of-the-art scalability, reliability studies of the hafnium doped layers showed low endurance characteristics.

Typically, $HfO_2$ based ferroelectric capacitors have a high oxygen vacancy content resulting in a shorter endurance caused by an early breakdown of the device. Good endurance is reached for samples showing stronger anti-ferroelectric (AFE) properties. In the $HfZrO_2$ mixed oxide (HZ) case, a higher $ZrO_2$ content in the mixed HZ layer causes stronger AFE like properties. Since the endurance correlates to the AFE increase, a longer endurance is expected, which is beneficial for a FeCAP (FRAM) lifetime performance.

The memory applications of all existing electronics devices consume a certain amount of energy due to the sub-threshold region of operation, which requires power even in a neutral state of the operation. Solutions that would offer a decrease in the consumed power needed for operation are becoming more important as the number of integrated circuit devices rises in the everyday life.

Besides FE materials having a spontaneous electric polarization, there exist other materials exhibiting electric polarization by applying an external electric field. A material that exhibits anti-ferroelectric properties is described in literature as a crystal whose structure can be considered as being composed of two sub-lattices polarized spontaneously in antiparallel directions and in which a ferroelectric phase can be induced by applying an electric field. A typical example for an AFE material would be $PbZrO_3$.

Other related materials are field induced ferroelectric (e.g., pure $ZrO_2$) and relaxor ferroelectric type materials (e.g., $BaTiO_3$ or $PbMg_{1/3}Nb_{2/3}O_3$). In a field induced ferroelectric (FFE) material, a non-FE material exists, which transforms to a FE by applying an external electric field. In a relaxor ferroelectric type (RFE) material, FE seeds exist within a non FE neighborhood (surrounding) structure. By applying an external electric field, FE phase regions increase within the material.

In all three of these cases, the FE properties increase and decrease in correlation to an external applied field. In all cases, a clearly distinct state is present. The correlation charge-voltage characteristic hysteresis curves of these materials displaying charge polarization depending on an external field (e.g., by an external voltage) exhibit a "pinched hysteresis loop" where the correlation charge-voltage characteristic (hereinafter referred to simply as the charge-voltage characteristic) has a first hysteresis loop in the positive voltage regime, a second hysteresis loop in the negative voltage regime, and the charge is linearly related to voltage in the immediate vicinity of 0 volts (corresponding to the absence of an electric field). These types of materials cannot be directly used for non-volatile data storage. Sensing with zero voltage will cause a depolarization, resulting in a loss of the stored information. Within this text, these three types of material exhibiting a pinched hysteresis loop are called a "pinched hysteresis loop" (PHL) ferroelectric materials (or simply "PHL materials") and include all three mentioned types of material: AFE, FFE, and RFE.

SUMMARY

Described herein is a new concept for integration of an anti-ferroelectric like material into an integrated circuit element. Anti-ferroelectric like materials are characterized with pinched hysteresis loops (PHL) with application of an external electric field. Materials which have such behavior as a result of an applied external electric field are: anti-ferroelectric (AFE), field induced ferroelectric (FFE) and relaxor ferroelectric (RFE) type materials. The inventive concept disclosed herein enables elements employing a PHL material to be used as a ferroelectric in ferroelectric random access memory (FRAM) devices. The device structure provides an internal (built-in) bias electric field that essentially shifts the charge-voltage characteristic of the PHL material to align (e.g., center) one of the two hysteresis loops with a zero voltage state such that the PHL material is capable of being maintained in a selected polarization state in the absence of an external electric field. According to one option, a device comprises a PHL material sandwiched between two electrodes with different workfunction values that induce the internal bias electric field that shifts the readout of the device and enables the integration and usage of the integrated circuit as, for example, a binary non-volatile memory. According to another option, fixed electric charges can be introduced into the PHL material and/or in an interlayer between the two electrodes to provide the internal bias electric field. Optionally, both the technique of having electrodes with different workfunction values and having fixed electric charges disposed between the electrodes can be used to induce the internal bias electric field required to shift the charge-voltage characteristic of the PHL material.

The inventive integration concept of a pinched hysteresis loop random access memory (PHLRAM) described herein provides several advantages over the prior art FRAM schemes by utilization of the new stack with asymmetric electrodes. This includes a stack comprising an PHL material sandwiched between electrodes with asymmetric workfunction values and/or fixed electric charges needed for induction of an internal, in-built bias electric field that enables improved data storage and read-out.

Classical non-volatile ferroelectric memory cells are based on a metal-insulator-metal (MIM) capacitor coupled with an access transistor. In these devices, the capacitor comprises two metal layers (electrodes) with similar workfunction values and a ferroelectric layer in between. This capacitor, together with the metal-oxide-semiconductor (MOS) access transistor, builds one memory cell capable of storing one binary bit of data. Metal layers (electrodes) used in this system are characterized by similar workfunction values for both electrodes, which generate a uniform electric field (without a bias towards one side) over the ferroelectric of the device.

The integration concept and stack described herein relies on the utilization of the pinched hysteresis loop (PHL) material layer instead of the ferroelectric one and on an internal bias electric field that shifts the charge-voltage characteristic of the (PHL) material in such a way that one of the two hysteresis loops of the PHL material is aligned with a "zero voltage" condition, i.e., in the absence of an external electric field, the device can be maintained in one of two polarization states because one of the two hysteresis loops of the PHL material has been shifted to straddle the zero voltage condition in the charge-voltage characteristic. To reach a non-volatile memory device, an internal bias field needs to be generated to shift the hysteresis curve (e.g., by −1 Volt). The bias field can be generated by two electrodes with a workfunction difference of about 1 eV. According to another option, the internal bias field can be achieved by charges stored in the PHL material layer itself or in an additional layer between the electrodes as well. A combination of different electrode workfunction values and internal charges can also be used to achieve the required internal bias electric field.

Prior art $HfO_2$ based ferroelectric capacitors have a high oxygen vacancy content resulting in a shorter endurance caused by early breakdown of the devices. A good lifetime is reached for samples showing stronger PHL properties, e.g., $Si:HfO_2$ or HfZrO. In the $HfZrO_2$ mixed oxide (HZ) case, a higher $ZrO_2$ content in the mixed HZ layer causes stronger AFE like properties. Accordingly, an endurance increase is directly correlated to a PHL increase, which is beneficial for FRAM lifetime performance. Moreover, ion displacement of the FE based memories induces additional stress in the device's crystal lattice, which results in a decrease in the device lifetime. In contrast to the FE memories, the inventive concept described here does not experience the aforementioned ion displacement stress, which improves performance metrics of the device such as stability and endurance.

In addition, interfacial layers within a dielectric $ZrO_2$ layer reduce the leakage current by avoiding a grain boundary reaching from the bottom to the top electrode. Accordingly, a longer lifetime of the device is expected due to a reduction of defect movement along grain boundaries, resulting in a later occurrence of a breakdown event.

$ZrO_2$ based thin films with interlayer are fully CMOS and 3D integrable and readily available in a semiconductor DRAM process. Moreover, a PHL material, such as $ZrO_2$, has a higher endurance (lifetime) than a doped $HfO_2$ material. Similar behavior may be achievable for other PHL, AFE or relaxor type materials. In addition, an $Al_2O_3$ or other high band gap dielectric interlayer with high crystallization temperature improves reliability and endurance, accordingly. Furthermore, an $Al_2O_3$ interlayer decreases the grain size of the PHL layer and therefore improves the variability of the device.

In order to enable usage of a PHL material as an non-volatile memory device, an internal bias field needs to be generated to shift the hysteresis curve (e.g., by −1V). The bias field can be generated by two electrodes with a workfunction difference of about 1 eV. This inventive gate stack integration result in a so-called one transistor-one capacitor (1T-1C) memory architecture.

Besides a 1T-1C memory concept, a usage of a semiconductor instead of the bottom metal electrode would enable integration of the FE layer in a so called single transistor (1T-concept) non-volatile memory and a novel PHL-MOS 1T memory device.

In addition to the previously discussed memory application, inventive integration of the materials that exhibit a pinched-hysteresis would decrease the power consumption of the integrated device. Prior art concepts suffer from the power dissipation coming from the subthreshold voltage, which consumes power even when the integrated circuit is not turned on. An application of the inventive concept described herein enables usage of so-called steep subthreshold devices, which reduces the amount of consumed energy in the devices of a non-turned on device and reduces the height of the voltage for turning on the device (threshold voltage).

Besides low power electronics and memory applications, the inventive device stack with two different workfunction metal electrodes proposed herein can be used for energy harvesting applications in electro caloric devices, e.g., based on the pyro electric effect, ferroelectric and pyroelectric sensors, piezoelectric devices, so-called supercapacitors, and other devices using the FE or PHL properties of the dielectric material in a capacitor based configuration.

BRIEF DESCRIPTION OF THE DRAWINGS

FIG. 1A is a diagram illustrating the polarization orientation with and without an applied external field for a device having a ferroelectric (FE) material layer characterized by a ferroelectric hysteresis loop.

FIG. 1B is a diagram illustrating the polarization orientation with and without an applied external field for a device having a field induced ferroelectric material (FFE) layer characterized by a pinched hysteresis loop (PHL).

FIG. 2A is a graph illustrating charge as a function of voltage for a material with ferroelectric charge-voltage characteristics.

FIG. 2B is a graph illustrating current as a function of voltage for a material with the ferroelectric charge-voltage characteristics shown in FIG. 2A.

FIG. 2C is a graph illustrating charge as a function of voltage for a material with pinched-hysteresis charge-voltage characteristics according to an example of the inventive integration.

FIG. 2D is a graph illustrating current as a function of voltage for a material with the pinched-hysteresis charge-voltage characteristics shown in FIG. 2C.

FIG. 6A illustrates the measurement results of the inventive concept described herein.

FIG. 6B illustrates the outcome of the usage of electrodes with different workfunction values.

FIG. 7A illustrates a gate stack of the inventive concept involving a PHL material sandwiched between two different workfunction metal electrodes.

FIG. 7B illustrates a gate stack of the inventive concept involving a PHL material sandwiched between a metal electrode and the semiconductor substrate with different workfunction values.

FIGS. 10A-10C illustrate examples of three different memory cell stack based on a fixed charge layer needed for generation of the built-in bias field and centering of the pinched hysteresis according to the inventive implementation described herein.

DETAILED DESCRIPTION

Described herein is a new concept for integration of a PHL material in an integrated circuit. These materials are characterized with a pinched hysteresis loop during application of an external electric field. Materials that exhibit such behavior as a result of an applied external electric field are: a field induced ferroelectric (FFE), a anti-ferroelectric (AFE), and a relaxor type ferroelectric (RFE) material.

In the following, a detailed description based on referencing the figures is presented. It is to be understood that the features of the various exemplary embodiments described herein may be combined with each other, unless specifically noted otherwise.

FIG. 1A is a diagram illustrating a layered device having a ferroelectric (FE) material disposed (sandwiched) between a top electrode 101A and a bottom electrode 103A. The left portion of FIG. 1A shows the polarization orientation 102A of the FE material without an applied external electric field, and the right portion of FIG. 1A shows the polarization orientation 104A of the FE material with an applied external electric field. In such ferroelectric memory devices, the polarization state determines the information to be stored. The binary states of 0 and 1 are represented through the positive and negative states of polarization, respectively shown on the left and right sides of FIG. 1A.

FIG. 1B differs from FIG. 1A in that, instead of a ferroelectric (FE) material, a field induced ferroelectric (FFE) material is disposed between the top electrode 101A and bottom electrode 103A. The left portion of FIG. 1B shows the polarization behavior of the FFE material in the absence (102B) and presence (104B) of an electric field. As seen in the left portion of FIG. 1B, if the external excitation field is absent, there are no oriented domains and no resulting polarization. In the right portion of FIG. 1B, the application of an external electric field induces polarization and orientation of the domains towards the side of the applied field.

Figures 1C, 1D:
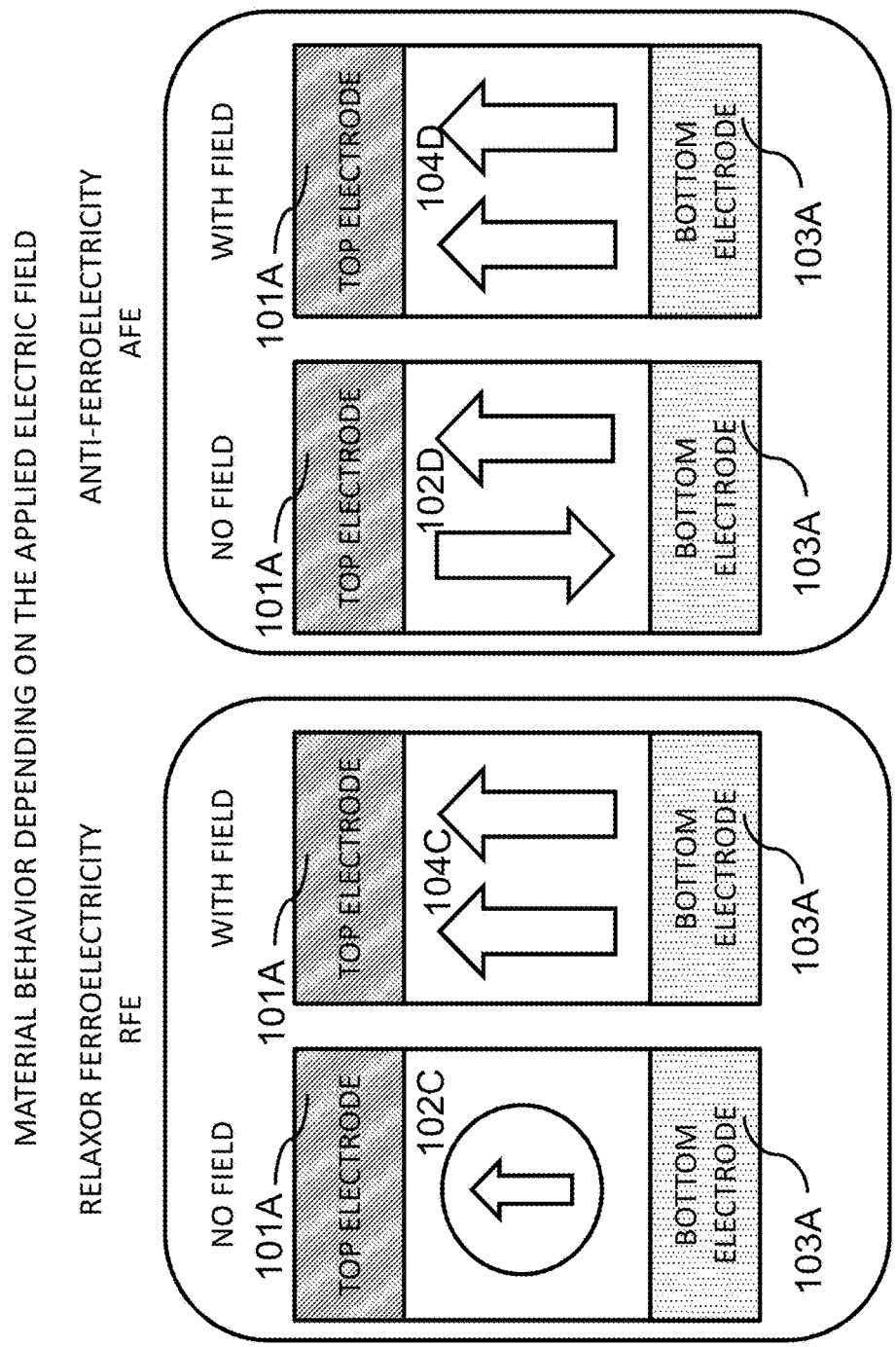
FIG. 1C is a diagram illustrating the polarization orientation with and without an applied external field for a device having a relaxor ferroelectric material (RFE) layer characterized by a pinched hysteresis loop (PHL).
FIG. 1D is a diagram illustrating the polarization orientation with and without an applied external field for a device having an anti-ferroelectric material (AFE) layer characterized by a pinched hysteresis loop (PHL).

FIG. 1C illustrates a relaxor ferroelectric (RFE) material disposed between the top electrode 101A and bottom electrode 103A. The left portion of FIG. 1C shows the polarization behavior of the RFE material in the absence (102C) and presence (104C) of an external electric field. As seen in the left portion of FIG. 1C, if the external excitation field is absent, polarization exists in only a small fraction of the RFE layer (represented graphically by an arrow in a circle). In the right portion of FIG. 1C, the application of an external electric field causes the polarized fraction of the RFE layer to grow, resulting in a polarized RFE layer with domains oriented in the same manner as that of FIG. 1B.

FIG. 1D illustrates an anti-ferroelectric (AFE) material disposed between the top electrode 101A and bottom electrode 103A. The left portion of FIG. 1D shows the polarization behavior of the AFE material in the absence (102D) and presence (104D) of an external electric field. As seen in the left portion of FIG. 1D, if the external excitation field is absent, the AFE material exhibits opposing polarization as well as opposing domain orientation. In the right portion of FIG. 1D, the application of an external electric field induces polarization and orientation of the domains towards the side of the applied field, resulting in a polarized AFE layer with domains oriented in the same manner as that of FIGS. 1B and 1C.

Described herein is an inventive approach for integration of a PHL material into an integrated circuit. Based on this approach, a memory device concept is disclosed. Each memory device comprises a PHL material sandwiched between two electrodes. The device structure provides an internal (built-in) bias electric field that shifts the charge-voltage characteristic of the PHL material to align one of the two hysteresis loops with a zero voltage state (i.e., one of the two hysteresis straddles the zero voltage state of the charge-voltage characteristic) such that the PHL material is capable of being maintained in a selected polarization state in the absence of an external electric field. According to one option described herein, the top and bottom electrodes comprise different materials having different workfunction values that induce a built-in bias electric field which allows storage and readout of data within the non-volatile memory device. According to another option, electric charges can be introduced into the PHL material and/or in an interlayer between the two electrodes to provide the internal bias electric field. Optionally, both the technique of having electrodes with different workfunction values and having fixed electric charges disposed between the electrodes can be used to induce the internal bias electric field required to shift the charge-voltage characteristic of the PHL material.

FIG. 2B illustrates the current-voltage characteristic 201B of the ferroelectric material, which is characterized by a single positive peak and a single negative peak occurring as a consequence of the external field applied to the device via application of a sufficient positive or negative voltage. This current-voltage characteristic translates to a hysteretic charge-voltage behavior 201A shown in FIG. 2A, with two binary states used for discrimination of the two non-volatile states. This solution can be integrated in conventional ferroelectric random access memory architectures.

In contrast to a ferroelectric material, FIG. 2C illustrates the "pinched hysteresis loop" charge-voltage characteristic 201C associated with the FFE, RFE, and AFE materials shown in FIGS. 1B, 1C, and 1D, collectively referred to as PHL materials. The PHL charge-voltage characteristic exhibits three material phases, where the charge follows a first hysteresis loop for positive voltages, a second hysteresis loop for negative voltages, and is linearly related to voltage in the vicinity of 0 volts. FIG. 2D correspondingly illustrates the charge-voltage characteristic 201D of a PHL material (FIG. 2D), characterized by two positive and two negative peaks occurring as a consequence of the external field applied to the device via a suitable voltage. PHL materials have not previously been considered suitable for non-volatile information storage, since the data is lost when no field is applied, as suggested by the charge-voltage characteristic shown in FIG. 2C.

Figure 4:
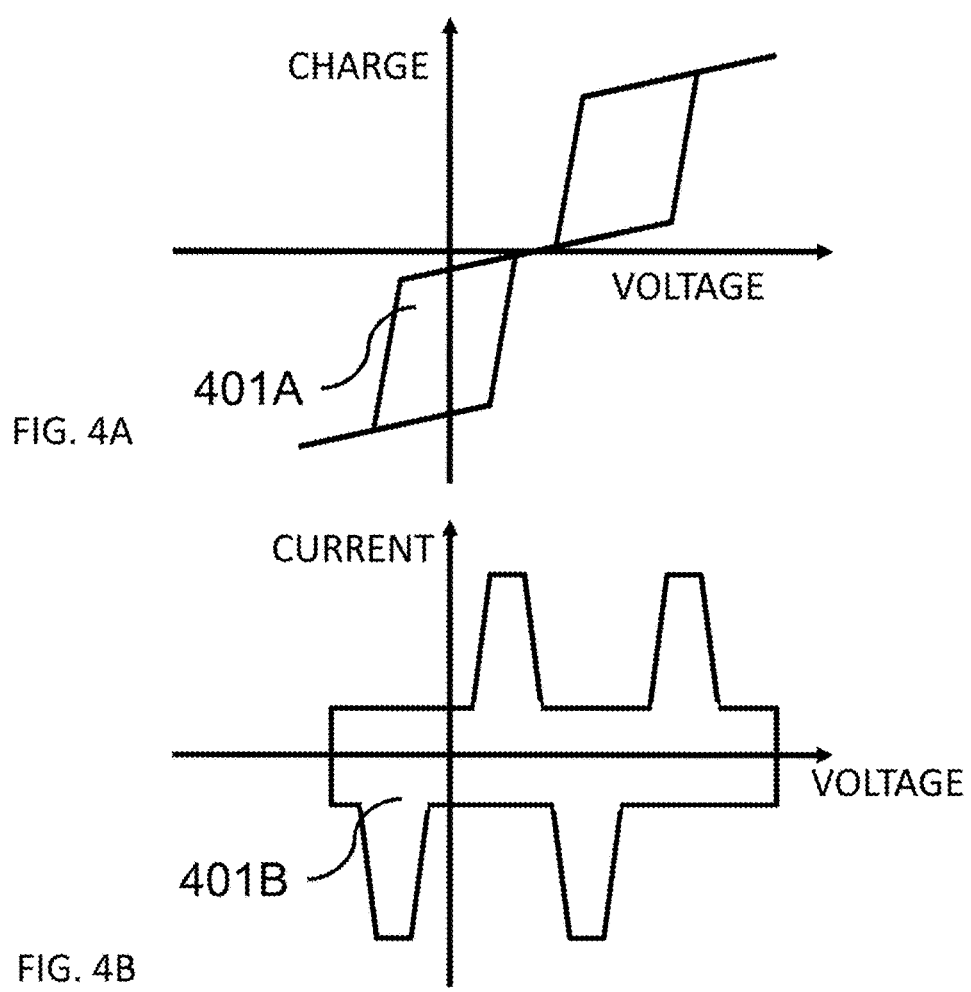
FIG. 4A illustrates the inventive integration concepts based on different workfunction values for the electrodes, which influence the corresponding charge-voltage characteristics that enable the utilization of PHL material as a non-volatile memory material.
FIG. 4B illustrates the inventive integration concepts based on different workfunction values for the electrodes, which influence the corresponding current-voltage characteristics that enable the utilization of PHL material as a non-volatile memory material.
Figure 5:
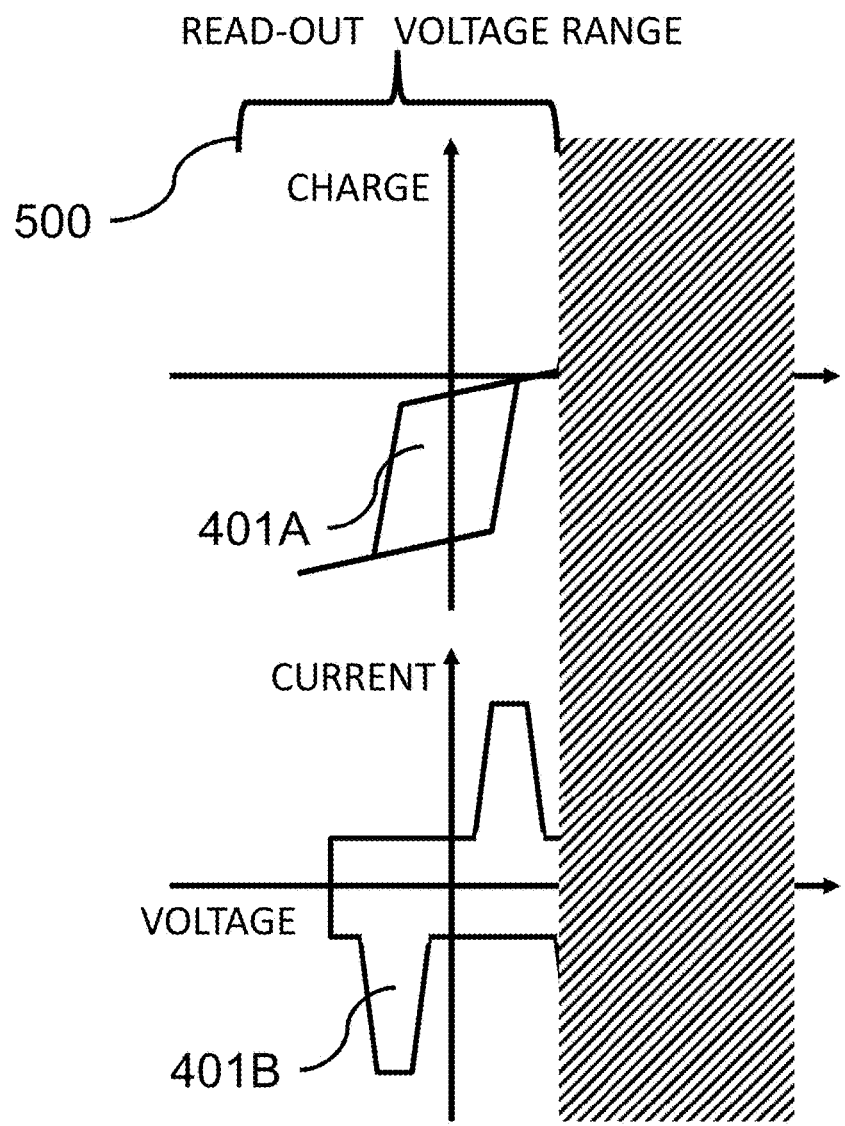
FIG. 5 illustrates an example of the integration of the different workfunction electrode materials inventive concept together with the adjusted read-out of the PHL material non-volatile memory device in accordance with the inventive concept described herein.

In the following, the basics of the inventive energetic scheme of the PHLRAM embodiment described in FIGS. 4 and 5 will be elucidated.

Integration of a PHL material between two metal electrodes with different workfunctions induces a built-in bias voltage shift needed for centering, relative to 0 volts, the position of one of the two charge-voltage loops of the charge-voltage characteristic. This shifting enables the usage of the PHL material as a material for binary memory applications using of one of the two charge-voltage loops. Centering of one of the two hysteresis loops around zero volts by biasing with different workfunction value materials enables the usage and integration of a PHL material in a two state non-volatile memory device, which preserves the binary state even after the removal of the external excitation field.

After centering one of the two PHL charge-voltage hysteresis loops around zero volts, low power read-out of the binary state of the device can be performed by applying symmetric voltage conditions on the electrodes.

Figure 3:
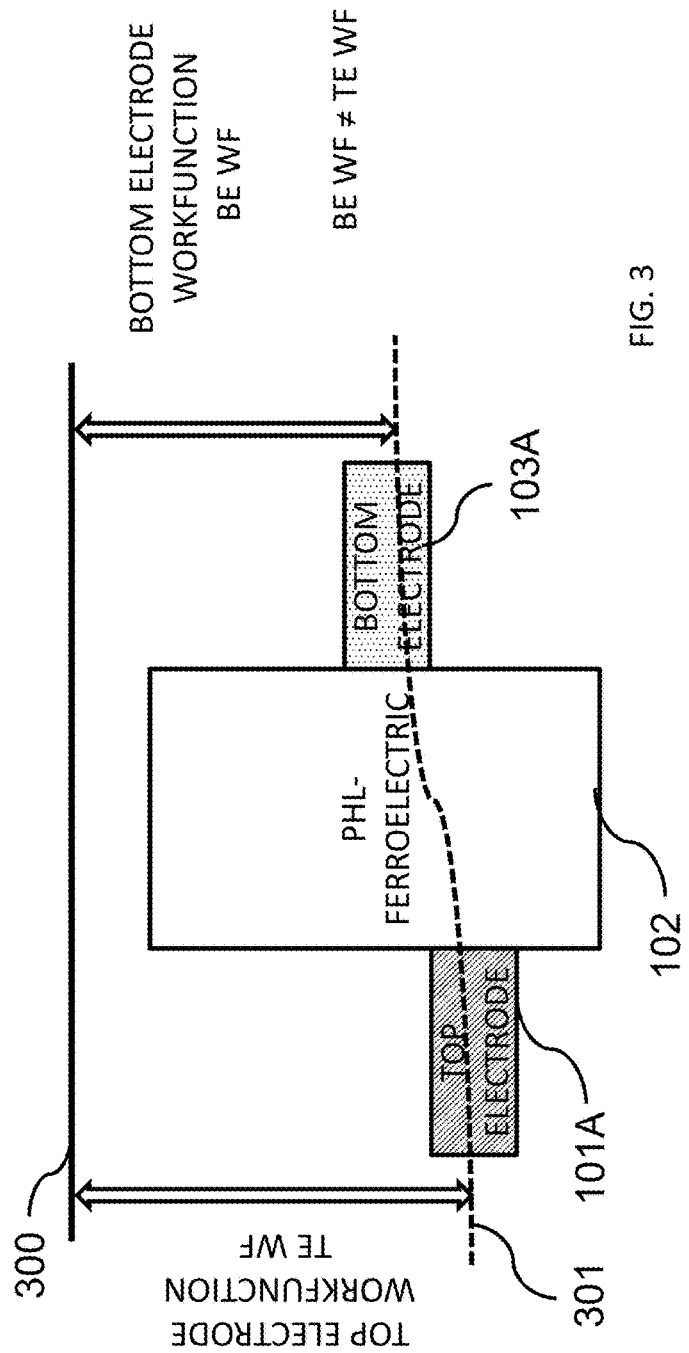
FIG. 3 illustrates the inventive integration concepts based on different workfunction values for the electrodes, which enables the utilization of PHL material as a non-volatile memory material.

FIG. 3 illustrates an example of the energetic band diagram for the implementation of the non-volatile memory. With a ferroelectric material, the charge voltage behavior 201A (FIG. 2A) is centered around zero, so there is no need to induce an artificial additional shift of the characteristics. In contrast, the pinched charge-voltage characteristics 201C shown in FIG. 2B is characterized by a double hysteresis loop, and neither of the two hysteresis loops is centered around zero electric field. In order to induce the shift needed to center the charge-voltage relation of one of the two hysteresis loops and define the two different binary states of 1 and 0, electrodes with different workfunction values can be used.

The PHL material can be of a field induced ferroelectric type of layer comprising $Zr_aX_bO_2$, with X being an element of the periodic table with a smaller ionic radius than Zr and a>0, b>0. Suitable X elements can be one of Hf, Si, Al, Ge, elements of the second group of the periodic table and a>0, b>0. In addition to this combination, the PHL material layer may comprise $Hf_aX_bO_2$, with X being an element of the periodic table with a smaller ionic radius than Hf and a>0, b>0. Suitable elements for this combination can be one of the elements within the second group of periodic table (Zr, Si, Al, Ge) where the a>0, b<0 as before. The PHL material layer can be in the thickness range between 1 and 20 nm.

Another possibility for the PHL material can be of a field induced ferroelectric type consisting of a pure $ZrO_2$ layer or comprising a $ZrO_2$ or $HfO_2$ based dielectric material.

A third possibility for the PHL material can be of a relaxor type ferroelectric material (e.g., $BaTiO_3$ or $PbMg_{1/3}Nb_{2/3}O_3$). And a fourth possibility for the PHL material can be of an AFE type material like $PbZrO_3$.

In the following, the inventive concept based on the different workfunction electrode materials is explained in connection with the energetic diagram of FIG. 3 with reference to the embodiments shown in FIGS. 1B, 1C and 1D. The workfunction represents the energy needed to be given to the charge carrier so that it can leave the closed material system. More specifically, the workfunction represents the difference between an electrode's Fermi level 301 and the vacuum 300 level. FIG. 3 illustrates the energetic outcome of the integration of the different workfunction materials 101A (top electrode) and 103A (bottom electrode) and the PHL ferroelectric layer 102 exhibiting pinched hysteresis (comprising an AFE, FFE or RFE layer) in accordance with the implementation of the inventive concept described herein. Therefore, the energetic value of the first, top electrode 101A has to be different from the energetic value of the second, bottom electrode 103A. This energetic difference induces a built-in bias electric field that shifts the charge voltage characteristics of the PHL layer 102.

In this specific application the first electrode and the second electrode have a workfunction value difference of 0.7 to 1.5 eV and the first electrode and the second electrode comprise a material of or a combination of: Ti, TiN, TiSi, TiAlN, TaN, TaCN, TaSi, W, WSi, WN, Al, Ru, RuO, $RuO_2$, Re, Pt, Ir, IrO, $IrO_2$, $In_2O_3$, InSnO, SnO, ZnO, Ti, Ni, NiSi, Nb, Ga, GaN, C, Ge, Si, doped Si, SiC or GeSi, providing the 0.7 to 1.5 eV workfunction difference.

FIGS. 2C and 2D illustrate the influence of the usage of the electrodes with the same workfunction values on the charge voltage characteristic and current voltage characteristic, respectively, which is in correspondence with a conventional solution. The inventive concept illustrated in FIG. 3 based on the usage of electrodes with different workfunction values induces the shift in the previous discussed characteristics. Therefore, integration of the different workfunction materials induces a built-in electric field which centers one of the pinched (double) hysteresis around 0 volts and creates the shifted pinched hysteresis 401A as illustrated in FIG. 4A. Corresponding shifted current-voltage characteristic 401B is illustrated in FIG. 4B.

Depending on the chosen electrode materials, one of the two pinched loops can be centered. It is of advantage to choose the work function differences between the first and the second electrode such that one of the pinched (double) hysteresis is centered to zero external field as shown in FIG. 5. After centering the characteristics, a symmetric positive and negative electric field can be applied for reading and writing of the memory device. This read out range 500 is illustrated in FIG. 5 where low and symmetric operation electric field can be applied, resulting in a high lifetime and good retention of the state.

In a programming operation of the PHL memory cell, a voltage pulse is applied to the PHL material of the memory cell to change its state between a polarized and a non-polarized state, where this change in polarity corresponds, e.g., with a "0" or a "1" state. In terms of operation, a PHLRAM is similar to FeRAM. Programming is accomplished by applying a field across the PHL material layer by charging the plates on either side of it, forcing the lattice in a polarized or non-polarized state (depending on the polarity of the charge), thereby storing a "1" or "0." Sensing in a PHLRAM is the same as in a FeRAM. The transistor forces the cell into a particular state, say "0." If the cell had been storing a "0," nothing will happen in the output lines. If the cell had been storing a "1," the re-polarization of the lattice in the PHL-material layer will cause a brief pulse of current in the output as they push electrons out of the metal on the "down" side. The presence of this pulse means the cell had been holding a "1". Since this process "over-programs" the cell, sensing is a destructive process, and requires the cell to be re-programmed if it was changed.

Measured results of the embodiment described herein are illustrated in FIGS. 6A and 6B. FIG. 6A illustrates the measured result on the working device with two identical workfunction values where all four peaks are visible in the current-voltage characteristics. The inventive concept described herein is illustrated in FIG. 6B where the inventive concept comprising different workfunction electrodes (WF1−WF2=0.3 eV) induced a built-in field and current-voltage shift towards 0 volts in the measured characteristics.

FIGS. 7A and 7B illustrate two options for the electrode portion of the gate stack. Integration of the PHL layer 102 exhibiting hysteretic polarization can be performed in following two ways. First, as illustrated in FIG. 7A, a PHL material layer 102 can be sandwiched between two metal electrodes, e.g., first electrode 101A and second electrode 103A. According to a second integration option shown in FIG. 7B, the PHL material layer 102 can be sandwiched between a first, metal electrode 101A and a semiconductor layer 703 serving as the second electrode. The semiconductor electrode 703 can be a substrate, such as a wafer from silicon.

Figure 8A:
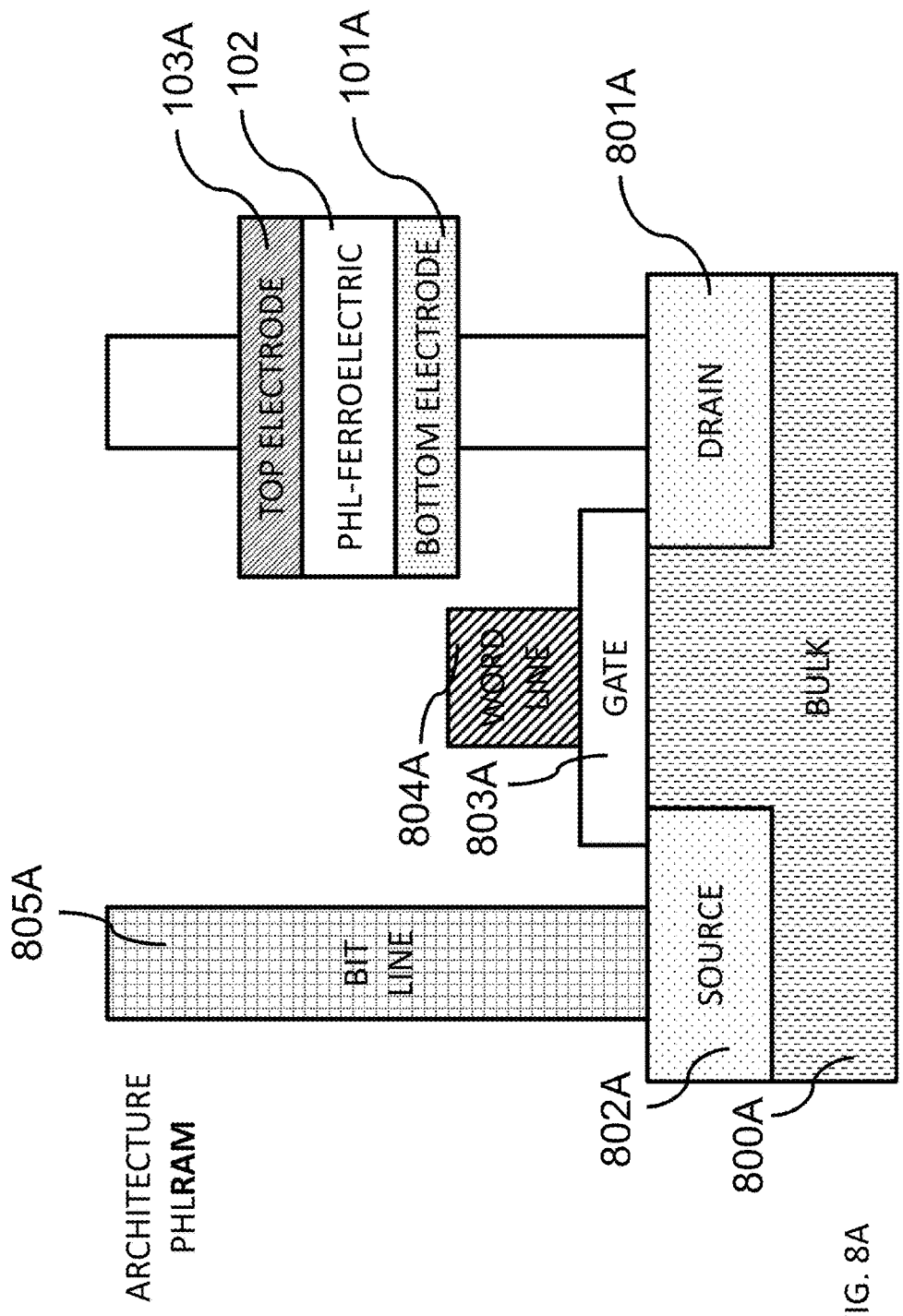
FIG. 8A illustrates an example implementation of the inventive concept using a PHLRAM memory cell architecture based on a capacitor and transistor integration.
Figure 8B:
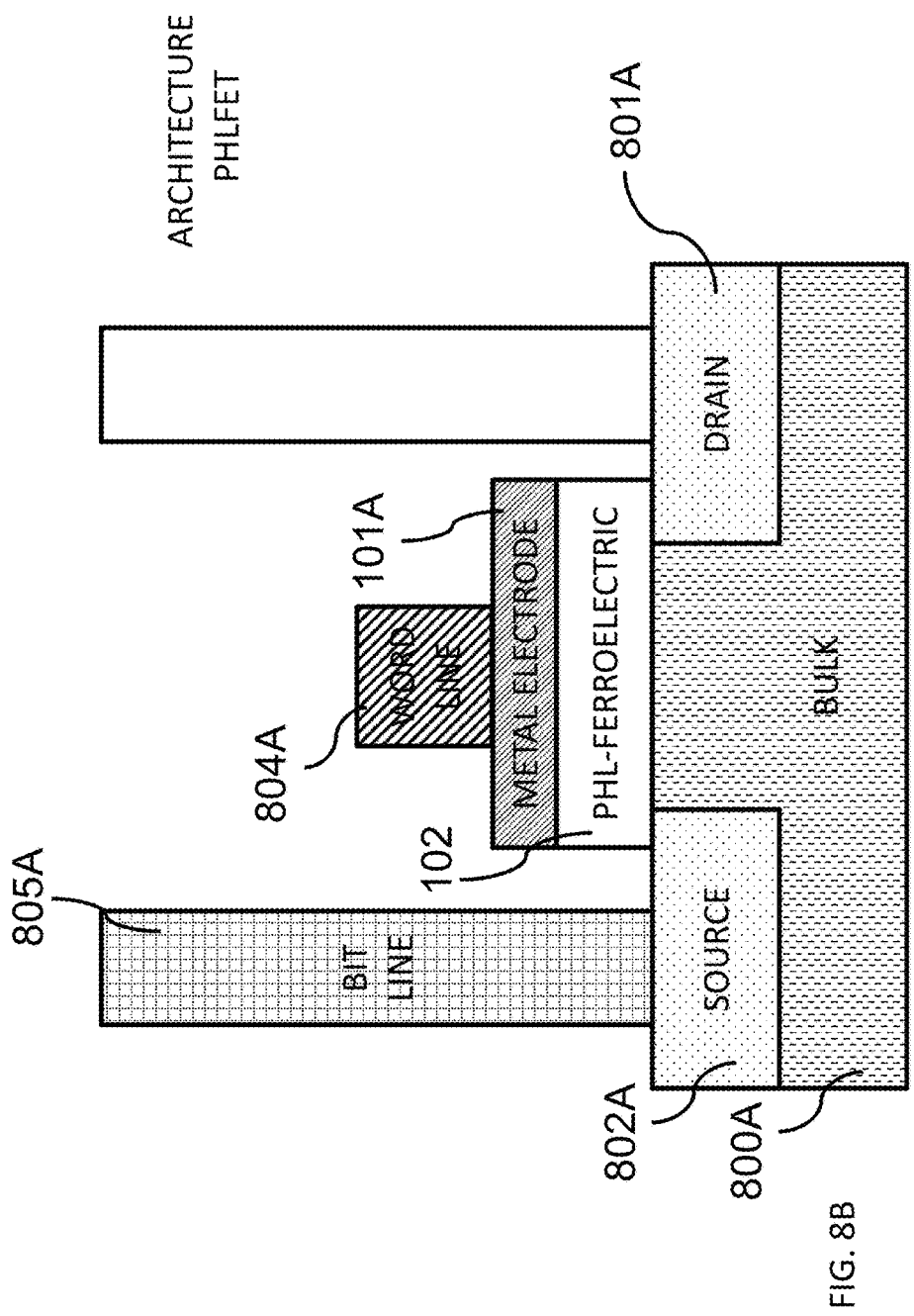
FIG. 8B illustrates an example implementation of the inventive concept using a PHL material FET (PHLFET) memory cell architecture based on a capacitor and transistor integration.

FIGS. 8A and 8B illustrate two examples of inventive memory cell concepts based on capacitor and transistor integration. FIG. 8A illustrates a cross-sectional view of one embodiment of an integrated circuit with reference to the inventive concept described herein, including a planar 1T-1C PHL material memory cell (PHLRAM). The PHLRAM memory cell includes source/drain regions 801A, 802A formed within a bulk carrier 800A such as a silicon substrate. Over a surface of the carrier 800A, a metal gate layer 803A is formed, which extends between source region 802A and drain region 801A. A bit line 805A is formed on top of source region 802A, and a word line 804A is formed on top of metal gate layer 803A. A storage element in accordance with the inventive concept described herein is coupled to the drain region 801A. In particular, a stacked structure comprising a bottom electrode 101A, a pinched hysteretic polarization layer 102, and a top electrode 103A is formed, wherein the top and bottom electrodes have different workfunctions. Thus, the storage element is formed in accordance with the arrangement shown in FIG. 7A.

FIG. 8B illustrates a cross-sectional view of one embodiment of an integrated circuit with reference to the inventive concept described herein, including a planar 1T PHL memory cell (PHLFET) in which the PHL storage layer is incorporated into the gate stack. As with the structure shown in FIG. 8A, the PHLFET memory cell of FIG. 8B includes source/drain regions 802A, 801A formed within a bulk carrier 800A, and a bit line 805A formed on top of the source layer 802A. A PHL ferroelectric layer 102 is form on a surface of carrier layer 800A, extending between source regions 802A and drain region 801A. A metal electrode 101A is formed on top of PHL ferroelectric layer 102, and a word line is formed on top of metal electrode 101A. In this manner, the structure shown in FIG. 7B is incorporated into the gate stack and formed by carrier layer 800A, PHL layer 102, and metal electrode 101A.

As a second device, the configuration of FIG. 7B can be used as a transistor. In such an application, the PHL material layer is used as a gate material. The properties of the transistor can be a displaced a current-voltage curve. This PHL material layer in the inventive transistor device will cause an extremely steep slope of such a current-voltage curve. Conventional concepts suffer from the power dissipation coming from the subthreshold voltage, which continues to consume power even when the integrated circuit is not turned on. In other words, today's transistors suffer from energy loss that is constantly "leaking" or being lost or wasted in the off-state. The most effective way to reduce power consumption in conventional logic circuits is to reduce the supply voltage ($V_{dd}$), since both static and dynamic power consumption depend strongly on $V_{dd}$. Unfortunately, the ability to scale $V_{dd}$ in conventional field effect transistor is material nature limited by the fact that the sub-threshold slope (SS) must be greater than 2.3 kBT/q (60 mV/decade) at room temperature. An application of the inventive concept described herein enables usage of the so-called steep subthreshold devices, which would reduce the amount of consumed energy in the devices of a non-turned-on device and would reduce the height of the voltage for turning on the device (threshold voltage). Innovative concept described herein exhibit negative capacitance that compensates the classic capacitance limit of the threshold voltage of the conventional integrated circuits. Therefore, a novel device characterized by a steep subthreshold slope exhibits a faster transition between off (low current) and on (high current) states.

As a third inventive device, the arrangement of FIG. 7A or FIG. 7B can be used as a piezoelectric device. In such an application, the PHL material is used in a piezoelectric element, sensor or actuator. The piezoelectric properties in PHL materials are used to initiate a linear electromechanical motion when applying a voltage to the device or to initiate a voltage on the device electrodes, when a mechanical pressure is applied to the PHL material.

As a forth inventive device the set-up of FIG. 7A or 7B can be used as a pyroelectric device. In such an application the PHL-material would be used in a pyroelectric infrared sensor or energy harvesting device. The pyroelectric properties in PHL materials are used to generate a temporary voltage when they are heated or cooled.

Figure 9A:
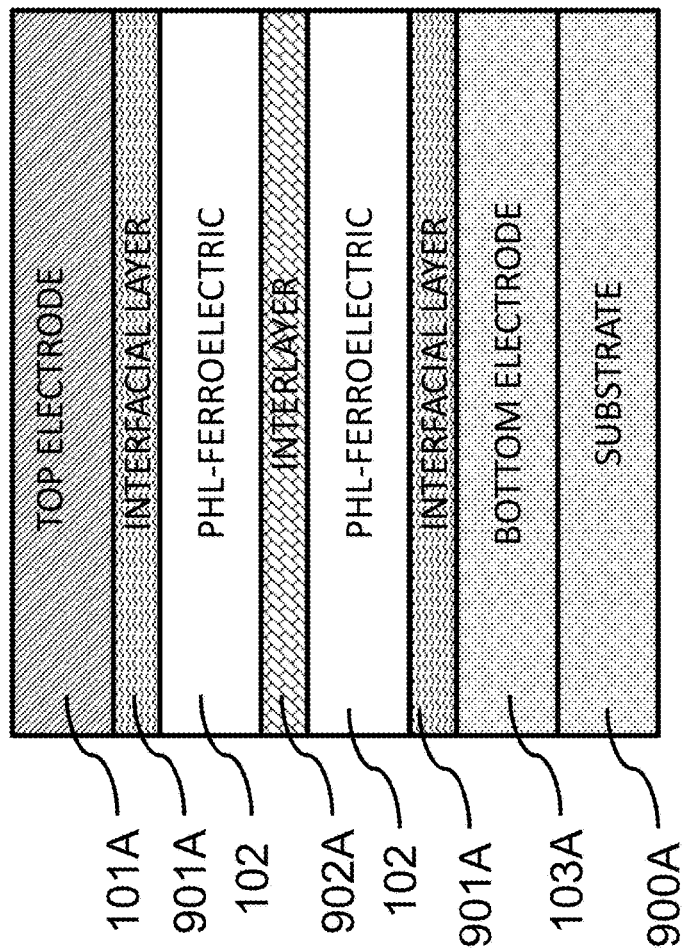
FIG. 9A illustrates an example of a detailed device stack of the inventive concept implemented according to FIG. 8A.

FIG. 9A illustrates an example of a dielectric stack sandwiched between top and bottom electrodes 101A and 103A. According to this implementation, the device stack comprises first and second interfacial layers 901A that are respectively adjacent to (i.e., directly connected to) top electrode 101A and bottom electrode 103A, two PHL layers 102, and an interlayer 902A disposed between and adjacent to the PHL layers 102. One of the PHL layers 102 is adjacent to the first interfacial layer 901A and the other PHL layer 102 is adjacent to the second interfacial layer 901A. Bottom electrode 103a is adjacent to a substrate 900A. Integration of this interlayer increases the lifetime of the device and prevents the movement of the defects and charge from one device side to the other (i.e., from the top electrode to the bottom electrode).

To achieve this improvement, it is beneficial to have the interlayer comprise a material with a high crystallization temperature or a high band gap. By way of a non-limiting example, the interlayer material can be one of $Al_2O_3$, SrO or other rare earth oxides.

Figure 9B:
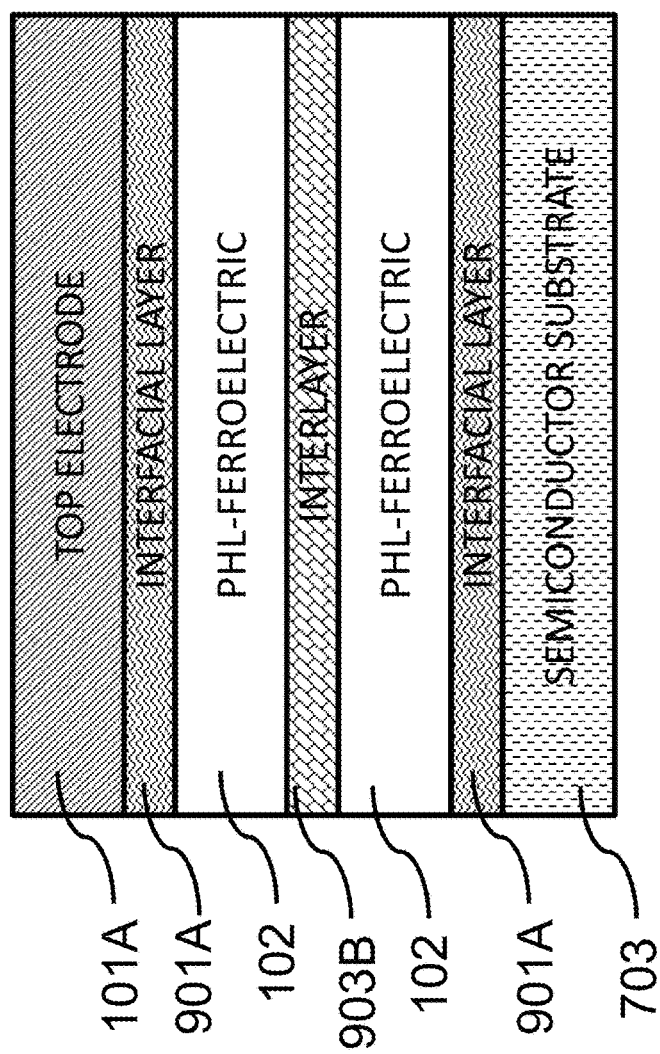
FIG. 9B illustrates an example of a detailed device stack of the inventive concept implemented according to FIG. 8B.

FIG. 9B illustrates an example similar to that of FIG. 9A but with the dielectric stack sandwiched between a top metal electrode 101A and a semiconductor substrate 703. According to this implementation, the device stack comprises first and second interfacial layers 901A that are respectively adjacent to top electrode 101A and semiconductor substrate 703, two PHL layers 102, and an interlayer 903B disposed between and adjacent to the PHL layers 102. One of the PHL layers 102 is adjacent to the first interfacial layer 901A and the other PHL layer 102 is adjacent to the second interfacial layer 901A. As with the previous example, integration of this interlayer increases the lifetime of the device and prevents the movement of the defects and charge from one side of the device to the other.

In addition, the internal bias field shifting the hysteresis can be achieved by storing charges in the PHL material layer itself. FIGS. 10A-10C respectively illustrate examples of three inventive memory device concepts based on a fixed charge layer integration wherein the fixed electrical charges stored in the dielectric layer cause an internal bias field that shifts the charge-voltage characteristic hysteresis loop. FIG. 10A represents the implementation of the inventive concept described herein with a layer comprising fixed charges 102X needed for inducing the shift stored within the pinched hysteresis layer 102 sandwiched between top and bottom electrodes 101A and 103A.

FIG. 10B illustrates the inventive concept described herein with an additional fixed charge built-in bias inducing layer 1000 formed atop of PHL layer 102, i.e., between and directly adjacent to top electrode 101A and PHL layer 102. The third inventive concept stack shown in FIG. 10C comprises the fixed charge layer 1000 sandwiched between and adjacent to two PHL layers 102.

In addition to the previous discussed single-level cell (SLC) memory application, inventive integration of multiple materials that exhibit different pinched-hysteresis properties in parallel would enable the usage of the inventive concept described herein as the multi-level cell (MLC). The multi-level cell (MLC) is a memory element capable of storing more than a single bit of information. The inventive integration of the innovative concept described herein is illustrated in FIG. 11.

Figure 11:
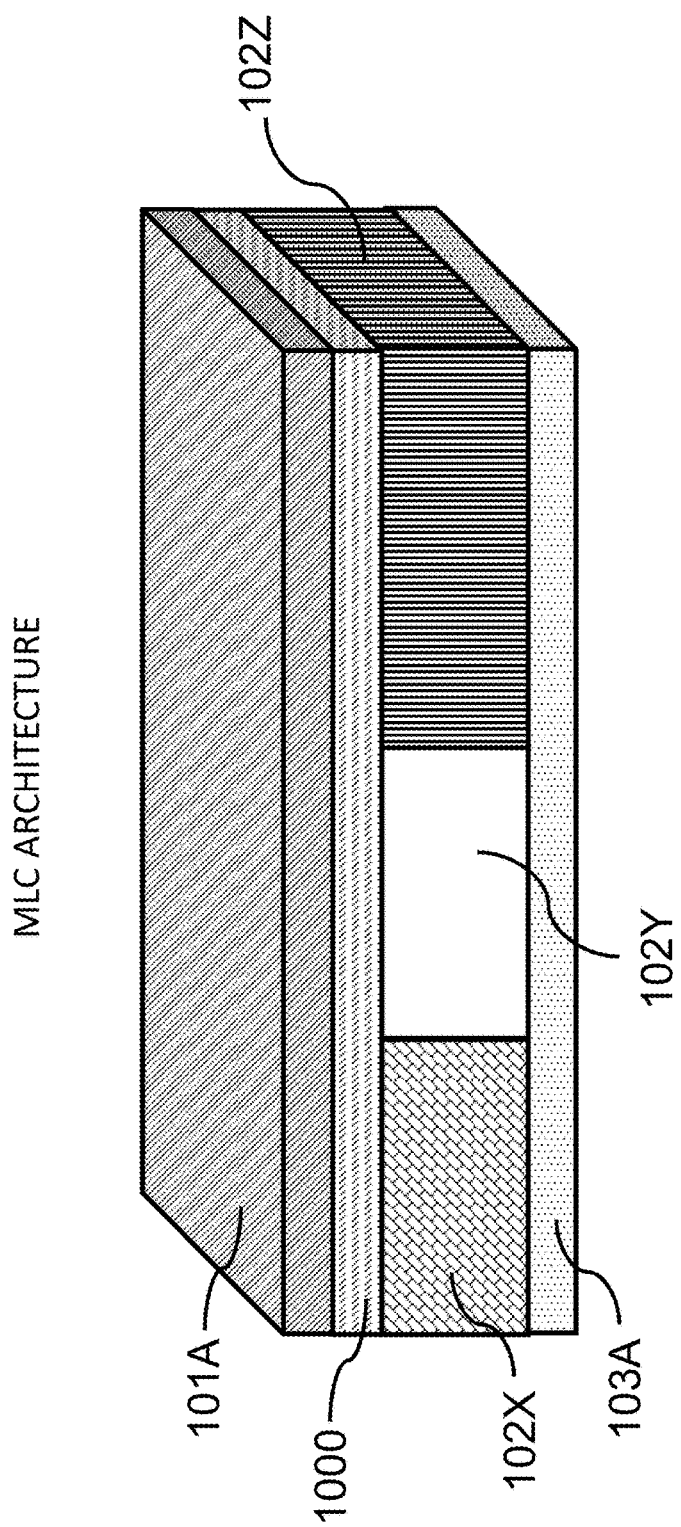
FIG. 11 depicts a cross-sectional view of an example embodiment of a metal PHL layer metal (MPHLM) structure, where the PHL material layer comprises multiple domains.

Referring to the cross-sectional view of FIG. 11, an example embodiment of a MLC structure includes a top electrode 101A comprising a metal material, and a bottom electrode 103A comprising a metal material. A PHL material oxide layer 102 is disposed between electrodes 101A and 103A. PHL material layer 102 comprises three distinct, side-by-side regions 102X, 102Y, and 102Z respectively having different PHL characteristics exhibiting pinched hysteresis loops with respective different double loop amplitudes. PHL material layer 102 can be grown, for example, on bottom electrode 103A. The regions 102X, 102Y, and 102Z of PHL material oxide layer 102 comprises respective different domains, which can coincide with different grains in a polycrystalline film. Each of the domains can comprise a different coercive voltage, originating from a different crystal orientation of the individual grain, a different internal stress, a different surface energy due to different grain sizes, a different doping concentration, or other differences in the physical or chemical composition. The term PHL material, as used herein, refers to a material that is at least partially in an pinched hysteresis state. For example, the PHL material may comprise any of $HfO_2$, $ZrO_2$, any ratio of Hf and Zr combined with oxygen (e.g., $Zr_xHf_{1-x}O_2$, where x<1) as well as any combinations thereof. An interfacial fixed charge layer 1000 can be formed between and adjacent to electrode 101A and PHL material oxide layer 102, comprising fixed charges needed for centering of the charge-voltage characteristics of the multiple regions 102X, 102Y and 102Z.

Although the specific embodiments have been illustrated and described herein, it will be appreciated by those of ordinary skilled in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. An integrated circuit element, comprising:
  a first electrode;
  a second electrode; and
  a layer disposed between the first and second electrodes and comprising a pinched hysteresis loop (PHL) material having a charge-voltage characteristic with two hysteresis loops, the layer having an internal bias field that shifts the charge-voltage characteristic of the PHL material to align one of the two hysteresis loops with a zero voltage state such that the PHL material is capable of being maintained in a selected polarization state in the absence of an external electric field.

2. The integrated circuit element of claim 1, wherein the first and second electrodes have different compositions resulting in a workfunction value difference between the first and second electrodes, the workfunction value difference inducing the internal bias field.

3. The integrated circuit element of claim 2, wherein the first and second electrodes have a workfunction value difference in a range of 0.7 to 1.5 eV.

4. The integrated circuit element of claim 1, wherein the layer further comprises fixed electrical charges that induce the internal bias field.

5. The integrated circuit element of claim 1, wherein the layer further comprises at least one interlayer disposed between the first and second electrodes.

6. The integrated circuit element of claim 5, wherein the at least one interlayer comprises fixed electrical charges that induce the internal bias field.

7. The integrated circuit element of claim 5, wherein the at least one interlayer comprises a material with a high crystallization temperature or a high band gap.

8. The integrated circuit element of claim 1, wherein the PHL material comprises a field induced ferroelectric (FFE) material.

9. The integrated circuit element of claim 8, wherein the FFE material comprises $ZrO_2$ or $Zr_aX_bO_2$, where X is an element of the periodic table, and a>0, b>0.

10. The integrated circuit element of claim 8, wherein the FFE material comprises $ZrO_2$ or $Zr_aX_bO_2$, wherein X is one of Hf, Si, Al, Ge, and elements of the second group of the periodic table, and a>0, b>0.

11. The integrated circuit element of claim 8, wherein the FFE material comprises $Hf_aX_bO_2$, wherein X is an element of the periodic table and a>0, b>0.

12. The integrated circuit element of claim 8, wherein the FFE material comprises $Hf_aX_bO_2$, wherein X is an element of the periodic table with smaller ionic radius than Hf and a>0, b>0.

13. The integrated circuit element of claim 8, wherein the FFE material comprises $Hf_aX_bO_2$, wherein X is one of Zr, Si, Al, Ge, and elements of the second group of the periodic table and a>0, b>0.

14. The integrated circuit element of claim 1, wherein the PHL material comprises an anti-ferroelectric (AFE) material.

15. The integrated circuit element of claim 1, wherein the PHL material comprises a relaxor type (RFE) material.

16. The integrated circuit element of claim 1, wherein the first and second electrodes comprise one or more of the following: Ti, TiN, TiSi, TiAlN, TaN, TaCN, TaSi, W, WSi, WN, Al, Ru, RuO, $RuO_2$, Re, Pt, Ir, IrO, $IrO_2$, $In_2O_3$, InSnO, SnO, ZnO, Ni, NiSi, Nb, Ga, GaN, C, Ge, Si, doped Si, SiC and GeSi.

17. The integrated circuit element of claim 1, wherein the layer has a thickness in a range of 1 to 20 nm.

18. The integrated circuit element of claim 1, wherein the integrated circuit element is a capacitor structure.

19. The integrated circuit element of claim 1, wherein the first electrode is a substrate.

20. The integrated circuit element of claim 1, wherein the integrated circuit element is a transistor structure.

21. The integrated circuit element of claim 1, wherein the integrated circuit element is a storage device.

22. The integrated circuit element of claim 1, wherein the integrated circuit element is a piezoelectric device or a pyroelectric device.

23. The integrated circuit element of claim 1, wherein the layer is a dielectric layer.

24. An integrated circuit element, comprising:
a first electrode having a first workfunction value;
a second electrode having a second workfunction value that is different from the first workfunction value of the first electrode; and
a layer disposed between the first and second electrodes, the layer comprising a pinched hysteresis loop (PHL) material whose charge-voltage characteristic is shifted by an internal bias field generated by a difference between the first and second workfunction values.

* * * * *